(12) United States Patent
Wang et al.

(10) Patent No.: US 10,777,686 B2
(45) Date of Patent: Sep. 15, 2020

(54) THIN FILM TRANSISTOR AND METHOD FOR MANUFACTURING THE SAME, ARRAY SUBSTRATE AND DISPLAY PANEL

(71) Applicant: BOE TECHNOLOGY GROUP CO., LTD., Beijing (CN)

(72) Inventors: Guoying Wang, Beijing (CN); Zhen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/203,075

(22) Filed: Nov. 28, 2018

(65) Prior Publication Data

US 2019/0305134 A1    Oct. 3, 2019

(30) Foreign Application Priority Data

Mar. 27, 2018    (CN) .......................... 2018 1 0259474

(51) Int. Cl.
*H01L 29/786*    (2006.01)
*H01L 27/12*    (2006.01)
(Continued)

(52) U.S. Cl.
CPC ...... *H01L 29/7869* (2013.01); *H01L 27/1225* (2013.01); *H01L 29/42384* (2013.01); *H01L 29/66742* (2013.01); *H01L 29/78645* (2013.01)

(58) Field of Classification Search
CPC .............. H01L 29/786–78696; H01L 1129/66742–6678; H01L 2924/13069; H01L 29/78681–78696; H01L 29/4908; H01L 29/42384–42392; H01L 2029/42388; H01L 29/7869;
(Continued)

(56) References Cited

U.S. PATENT DOCUMENTS

2015/0263174 A1* 9/2015 Yamazaki ......... H01L 29/78696
                                                    257/43
2017/0148862 A1    5/2017 Xu
2017/0317114 A1    11/2017 Noh et al.

FOREIGN PATENT DOCUMENTS

CN    104752489 A    7/2015
CN    107425011 A    12/2017

OTHER PUBLICATIONS

"Deposition of silicon nitride films using chemical vapor deposition for photovoltaic applications", K. Jhansirani, R.S. Dubey, M.A. More, Shyam Singh, Nov. 19, 2016, Elsevier, Results in Physics, pp. 1059-1063.*

(Continued)

*Primary Examiner* — Cuong B Nguyen
(74) *Attorney, Agent, or Firm* — Kinney & Lange, P.A.

(57) ABSTRACT

The present disclosure provides a thin film transistor and a method for manufacturing the same, an array substrate and a display panel. The thin film transistor includes a base substrate; a partially transparent layer on one side of the base substrate; a first gate electrode on one side of the partially transparent layer away from the base substrate; a second gate insulation layer on one side of the first gate electrode away from the base substrate; and an active layer on one side of the second gate insulation layer away from the base substrate. An orthographic projection of the partially transparent layer to the base substrate covers an orthographic projection of the active layer to the base substrate.

15 Claims, 3 Drawing Sheets

(51) Int. Cl.
*H01L 29/423* (2006.01)
*H01L 29/66* (2006.01)

(58) Field of Classification Search
CPC ......... H01L 29/78645; H01L 29/66742; H01L 27/1225; H01L 29/66969; H01L 29/78648; H01L 29/78633; H01L 29/78603; H01L 27/1218
See application file for complete search history.

(56) References Cited

OTHER PUBLICATIONS

First Chinese Office Action dated Dec. 3, 2019, received for corresponding Chinese Application No. 201810259474.6, 15 pages.

\* cited by examiner

THIN FILM TRANSISTOR AND METHOD FOR MANUFACTURING THE SAME, ARRAY SUBSTRATE AND DISPLAY PANEL

CROSS-REFERENCE TO RELATED APPLICATION

This application claims the benefit and priority of Chinese Application No. 201810259474.6, filed on Mar. 27, 2018. The entire disclosures of the application are incorporated herein by reference.

TECHNICAL FIELD

The present disclosure relates to the field of display technology, in particular to a thin film transistor and its manufacturing method and application. More particularly, the present disclosure relates to a thin film transistor and a method for manufacturing the same, an array substrate and a display panel.

BACKGROUND

In recent years, with the progress of society, the research and manufacture of display devices have entered the center of human social and cultural activities, and have made brilliant achievements in technology and commerce. With the shrinking market of cathode-ray tubes (CRTs), various flat panel display technologies compete with each other and are widely used in various communication devices such as televisions, mobile phones and computers, and then the flat panel display industry rises rapidly. Thin film transistors are core components in the flat panel display technology. As switch control elements or integrated components of peripheral driver circuits, performance of the thin film transistors directly affects the effect of flat panel displays.

SUMMARY

According to a first aspect, one embodiment of the present disclosure provides a thin film transistor. The thin film transistor includes a base substrate; a partially transparent layer on one side of the base substrate; a first gate electrode on one side of the partially transparent layer away from the base substrate; a first gate insulation layer on one side of the first gate electrode away from the base substrate; and an active layer on one side of the first gate insulation layer away from the base substrate. An orthographic projection of the partially transparent layer to the base substrate covers an orthographic projection of the active layer to the base substrate.

In one embodiment of the present disclosure, the active layer is made of oxide semiconductor material.

In one embodiment of the present disclosure, the orthographic projection of the partially transparent layer to the base substrate covers an orthographic projection of the first gate electrode to the base substrate; and an area of the orthographic projection of the partially transparent layer to the base substrate is less than an area of the base substrate.

In one embodiment of the present disclosure, the orthographic projection of the active layer to the base substrate and the orthographic projection of the first gate electrode to the base substrate coincide with each other; the first gate electrode is opaque; the base substrate, the first gate insulation layer and the active layer are transparent.

In one embodiment of the present disclosure, the thin film transistor further includes: a second gate electrode on one side of the active layer away from the base substrate; and a second gate insulation layer between the second gate electrode and the active layer. An orthographic projection of the second gate electrode to the base substrate and the orthographic projection of the first gate electrode to the base substrate coincide with each other. An orthographic projection of the second gate insulation layer to the base substrate and the orthographic projection of the first gate electrode to the base substrate coincide with each other. The second gate insulation layer and the second gate electrode are transparent.

In one embodiment of the present disclosure, the partially transparent layer is made of insulating material.

In one embodiment of the present disclosure, the thin film transistor further includes: a conductive layer. The conductive layer and the active layer are in an identical layer; the conductive layer is disposed at two opposite sides of the active layer; the conductive layer is formed by conducting material of the active layer. A sum of an orthographic projection of the conductive layer to the base substrate and the orthographic projection of the active layer to the base substrate coincides with the orthographic projection of the partially transparent layer to the base substrate.

In one embodiment of the present disclosure, the partially transparent layer is made of amorphous silicon.

In one embodiment of the present disclosure, the second gate electrode is made of at least one of indium tin oxide, aluminum doped zinc oxide, indium zinc oxide, and 4,4'-azo-1H-1,2,4-triazol-5-one ammonium salt.

In one embodiment of the present disclosure, the active layer is made of indium gallium zinc oxide.

According to a second aspect, one embodiment of the present disclosure provides a method for manufacturing a thin film transistor. The method includes: sequentially forming a partially transparent layer and a first gate electrode on one side of a base substrate with the partially transparent layer being made of insulating material; and forming an active layer on one side of the first gate electrode away from the base substrate with an orthographic projection of the partially transparent layer to the base substrate covering an orthographic projection of the active layer to the base substrate.

In one embodiment of the present disclosure, the orthographic projection of the partially transparent layer to the base substrate covers an orthographic projection of the first gate electrode to the base substrate; and an area of the orthographic projection of the partially transparent layer to the base substrate is less than an area of the base substrate.

In one embodiment of the present disclosure, the forming an active layer on one side of the first gate electrode away from the base substrate includes: sequentially forming a semiconductor material layer, a first gate insulation material layer, a second gate electrode material layer and a first photoresist material layer on one side of the first gate electrode away from the base substrate; by taking the base substrate, the partially transparent layer and the first gate electrode as a halftone mask, exposing and developing the first photoresist material layer from one side of the base substrate away from the partially transparent layer, thereby obtaining a first photoresist layer; wherein the partially transparent layer is semi-transparent; the first gate electrode is opaque; the base substrate, the semiconductor material layer, the first gate insulation material layer and the second gate electrode material layer are transparent; the first photoresist layer is made of positive photoresist and has a first thickness region and a second thickness region; a thickness of the first thickness region is greater than a thickness of the second thickness region; an orthographic projection of the first thickness region to the base substrate and the orthographic projection of the first gate electrode to the base substrate coincide with each other; a sum of the orthographic projection of the first thickness region to the base substrate and an orthographic projection of the second thickness region to the base substrate coincide with the orthographic projection of the partially transparent layer to the base substrate; and performing a first etching treatment to portions of the semiconductor material layer, the first gate insulation material layer and the second gate insulation material layer, which are not covered by the first photoresist layer, thereby obtaining a semiconductor material layer pattern, a first gate insulation material layer pattern and a second gate insulation material layer pattern. An orthographic projection of the semiconductor material layer pattern to the base substrate and the orthographic projection of the partially transparent layer to the base substrate coincide with each other.

In one embodiment of the present disclosure, after the first etching treatment, the forming an active layer on one side of the first gate electrode away from the base substrate further includes: performing a first ashing treatment to the first photoresist layer, thereby obtaining a first photoresist pattern with an orthographic projection of the first photoresist pattern to the base substrate coinciding with the orthographic projection of the first gate electrode to the base substrate; and performing a second ashing treatment to portions of the first gate insulation material layer pattern and the second gate electrode material layer pattern, which are not protected by the first photoresist pattern, thereby forming the second gate electrode and the second gate insulation layer. An orthographic projection of the second gate electrode and the orthographic projection of the first gate electrode to the base substrate coincide with each other; and an orthographic projection of the second gate insulation layer to the base substrate and the orthographic projection of the first gate electrode to the base substrate coincide with each other.

In one embodiment of the present disclosure, after the second etching treatment, the forming an active layer on one side of the first gate electrode away from the base substrate further includes: performing a conducting treatment to portions of the semiconductor material layer pattern, which are not protected by the first photoresist pattern, thereby forming a conductive layer and the active layer; wherein the orthographic projection of the active layer to the base substrate and the orthographic projection of the second gate electrode to the base substrate coincide with each other.

According to a third aspect, one embodiment of the present disclosure provides an array substrate that includes the above thin film transistor.

According to a fourth aspect, one embodiment of the present disclosure provides a display panel including the above array substrate.

BRIEF DESCRIPTION OF THE DRAWINGS

A brief introduction will be given hereinafter to the accompanying drawings which will be used in the description of the embodiments in order to explain the embodiments of the present disclosure more clearly. Apparently, the drawings in the description below are merely for illustrating some embodiments of the present disclosure. Those skilled in the art may obtain other drawings according to these drawings without paying any creative labor.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise indicated. The following description of exemplary embodiments is merely used to illustrate the present disclosure and is not to be construed as limiting the present disclosure.

Thin film transistors are core components in the flat panel display technology. As switch control elements or integrated components of peripheral driver circuits, performance of the thin film transistors directly affects the effect of flat panel displays. Since oxide itself is sensitive to light, electrical characteristics of an active layer made containing oxides may be changed when the active layer made containing oxides is exposed to light. Further, in an Oxide TFT with top grid structure, a threshold voltage of the TFT tends to drift greatly due to the lack of shielding effect of the bottom grid on the active layer. When the above TFT is applied in an OLED pixel circuit, it is easy to cause many problems such as residual images and line defects in displayed screens. Thus, structures of the thin film transistors are needed to be improved.

Various embodiment of the present disclosure are intended to solve at least to some extent one of the technical problems in the related art.

Various embodiments of the present disclosure were made based on the following findings of the inventors.

The inventors of the present disclosure found in the course of research that one metal shielding layer may be provided on a base substrate to prevent a TFT from being affected by light from the back of the base substrate in the related art, however, the presence of the metal shielding layer easily generates an induced electric field, induced charges and parasitic capacitance between the metal shielding layer and source-drain electrodes. The parasitic capacitance between the metal shielding layer and source-drain electrodes will adversely affect response speed and performance of the thin film transistor. Further, in the process of manufacturing a double gate structure in the related art, different masks are required for the bottom gate electrode and the top gate electrode, which leads to complex process and high production cost.

In view of this, after in-depth research, the inventors of the present disclosure provide a thin film transistor that includes a partially transparent layer added between a base substrate and a gate electrode, and the added partially transparent layer can effectively improve light stability of the thin film transistor. Further, the partially transparent layer is not conductive and thus there is no parasitic capacitance generated between the partially transparent layer and source-drain electrodes, thereby improving response speed and performance of the thin film transistor.

In view of this, one object of some embodiments of the present disclosure is to provide a thin film transistor that has higher gate control capability, higher response speed, better performance or higher light stability.

Figure 1:
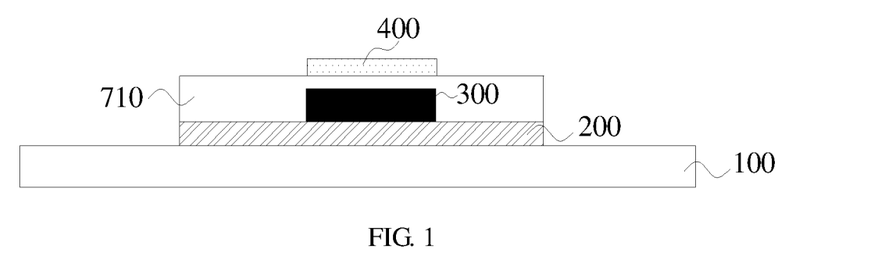
FIG. 1 is a sectional view of a thin film transistor according to some embodiments of the present disclosure.
Figure 2:
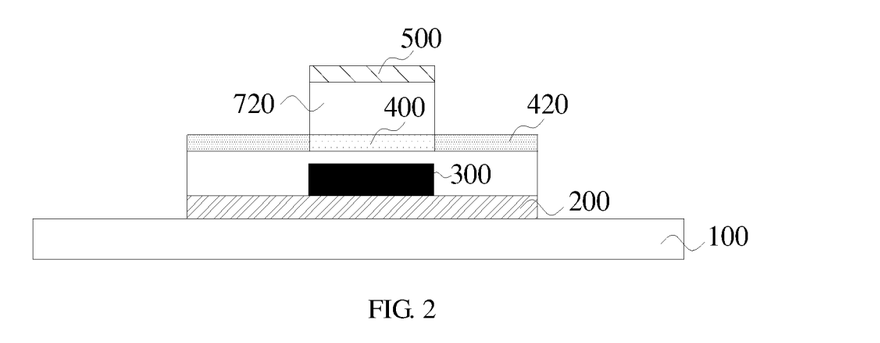
FIG. 2 is a sectional view of a thin film transistor according to some embodiments of the present disclosure.
Figure 3:
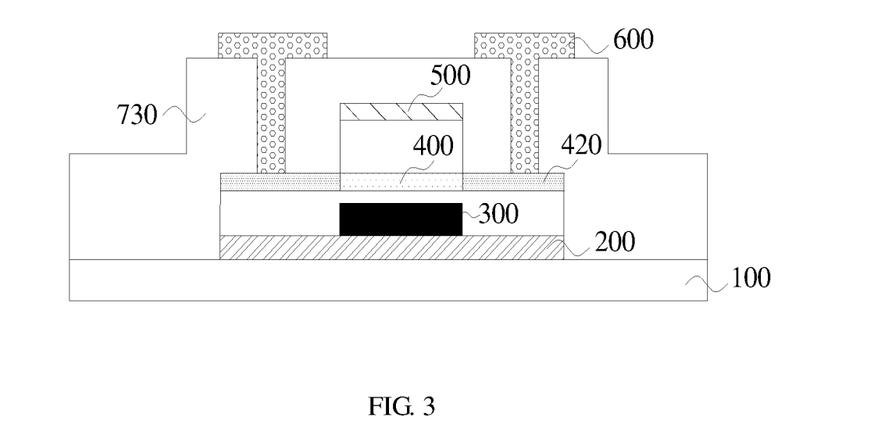
FIG. 3 is a sectional view of a thin film transistor according to some embodiments of the present disclosure.

According to one aspect of the present disclosure, a thin film transistor is provided according to some embodiments of the present disclosure. Referring to FIG. 1 to FIG. 3, the thin film transistor is described in detail hereinafter.

According to some embodiments of the present disclosure, referring to FIG. 1, the thin film transistor includes a base substrate 100, a partially transparent layer 200, a first gate electrode 300, a first gate insulation layer 710 and an active layer 400. The partially transparent layer 200 is disposed on one side of the base substrate 100. The first gate electrode 300 is disposed on one side of the partially transparent layer 200 away from the base substrate 100. The first gate insulation layer 710 is disposed on one side of the first gate electrode 300 away from the base substrate 100. The active layer 400 is disposed on one side of the first gate electrode 300 away from the base substrate 100. An orthographic projection of the partially transparent layer 200 to the base substrate 100 covers an orthographic projection of the active layer 400 to the base substrate 100. It should be noted that the partially transparent layer as used herein has a light transmittance rate in a range of from 20% to 80%.

In order to solve the technical problems in the related art that the active layer made of oxides is sensitive to light and the application of one metal light-shielding layer generates parasitic capacitance, in one embodiment of the present disclosure, the partially transparent layer 200 is added between the base substrate 100 and the first gate electrode 300, thereby effectively improving light stability of the thin film transistor. Further, the partially transparent layer 200 is not conductive and thus there is no parasitic capacitance generated between the partially transparent layer and source-drain electrodes, thereby improving response speed and performance of the thin film transistor.

In one embodiment of the present disclosure, materials of the active layer 400 are not particularly limited. For example, the active layer 400 may be made of semiconductor materials commonly used in the related art and the materials of the active layer 400 may be selected according to specific application of the thin film transistor. In one embodiment of the present disclosure, the active layer 400 may be made of oxide semiconductor materials, and thus the partially transparent layer 200 may cover an entire region where the active layer 400 is located, thereby greatly improving light stability of the oxide thin film transistor.

In one embodiment of the present disclosure, the orthographic projection of the partially transparent layer 200 to the base substrate 100 may cover an orthographic projection of the first gate electrode 300 to the base substrate 100. An area of the orthographic projection of the partially transparent layer 200 to the base substrate 100 is less than an area of the base substrate 100. In this way, in the manufacturing process, the base substrate 100, the partially transparent layer 200 and the first gate electrode 300 may be used as a light transmission region, a semi-transparent region and an opaque region of a halftone mask, respectively, thereby facilitating back exposure to form a self-aligned double gate structure. It should be noted that the term "cover" as used herein specifically refers to complete coverage.

In one embodiment of the present disclosure, the orthographic projection of the active layer 400 to the base substrate 100 and the orthographic projection of the first gate electrode 300 to the base substrate 100 coincide with each other. The first gate electrode 300 is opaque, and the base substrate 100, the first gate insulation layer 710 and the active layer 400 are transparent, and they can be used for back exposure to form a photoresist pattern. In this way, the pattern shape of the active layer 400 may be formed through photolithography from the back side by taking the first gate electrode 300 as the opaque region of the halftone mask and conductor treatment, thereby simplifying processes and reducing manufacture cost of the thin film transistor. It should be noted that the term "coincide" as used herein includes a situation of incomplete coincidence due to process errors; the term "light transmittance" means that a light transmittance rate is in a range of from 90% to 100%; and the term "semi-transparent" means that a light transmittance rate is in a range of from 20% to 80%.

In one embodiment of the present disclosure, as shown in FIG. 2, the thin film transistor may further include a second gate electrode 500 and a second gate insulation layer 720. The second gate electrode 500 is disposed on one side of the active layer 400 away from the base substrate 100. An orthographic projection of the second gate electrode 500 to the base substrate 100 and the orthographic projection of the first gate electrode 300 to the base substrate 100 coincide with each other. The second gate insulation layer 720 is between the active layer 400 and the second gate electrode 500. An orthographic projection of the second gate insulation layer 720 to the base substrate 100 and the orthographic projection of the second gate electrode 500 to the base substrate 100 coincide with each other. The second gate insulation layer 720 and the second gate electrode 500 are transparent. In one embodiment, pattern shapes of the second gate electrode 500 and the second gate insulation layer 720 may be formed through photolithography from the back side by taking the first gate electrode 300 as the opaque region of the halftone mask, thereby simplifying processes and reducing manufacture cost of the thin film transistor.

In one embodiment of the present disclosure, as shown in FIG. 2, the thin film transistor may further include a conductive layer 420. The conductive layer 420 and the active layer 400 are in an identical layer. The conductive layer 420 is disposed at two opposite sides of the active layer 400, and then is used as source and drain regions outside of a channel region of the active layer. The conductive layer 420 may be formed by conducting the material of the active layer 400. An orthographic projection of the conductive layer 420 as well as the active layer 400 to the base substrate 100 and the orthographic projection of the partially transparent layer 200 to the base substrate 100 coincide with each other. In this way, pattern shapes of the conductive layer 420 and the active layer 400, as a whole, may be formed through photolithography from the back side by taking the partially transparent layer 200 as the semi-transparent region of the halftone mask, thereby simplifying processes and reducing manufacture cost of the thin film transistor.

In one embodiment of the present disclosure, the partially transparent layer 200 may be semi-transparent. In the manufacturing process of the thin film transistor, the partially transparent layer 200 may be used as the semi-transparent region of the halftone mask, thereby facilitating patterning the active layer 400 and the conductive layer 420. In this way, fabrication of the double gate structure and the active layer requires only one mask, thereby further simplifying processes and reducing manufacture cost of the thin film transistor.

In one embodiment of the present disclosure, materials of the partially transparent layer 200 are not particularly limited, as long as the material is semi-transparent and electrically insulated, and the materials of the partially transparent layer 200 may be selected according to design requirements of the thin film transistor. In one embodiment of the present disclosure, the partially transparent layer 200 may be made of insulating material, and the first gate electrode may be directly formed on a surface of the partially transparent layer. Then, one buffer layer may be omitted compared to a design that adopts a metal light shielding layer. In some examples, the partially transparent layer 200 may be made of amorphous silicon (a-Si). As a non-conductive and semi-transparent semiconductor material, the amorphous silicon can enable the partially transparent layer 200 to improve light stability and usage stability of the thin film transistor.

In one embodiment of the present disclosure, materials of the first gate electrode 300 are not particularly limited, as long as the first gate electrode 300 of that material is opaque and conductive. For example, the first gate electrode 300 may be made of metal such as Mo, Al, Ti, Au, Cu, Hf or Ta. The materials of the first gate electrode 300 may be selected according to performance requirements of the thin film transistor.

In one embodiment of the present disclosure, materials of the active layer 400 are not particularly limited, as long as the active layer 400 of that material is transparent and has semiconductor function. The materials of the active layer 400 may be selected according to performance requirements of the thin film transistor. In one embodiment of the present disclosure, the active layer 400 may be made of indium gallium zinc oxide (IGZO), and thus the active layer 400 is transparent, thereby not affecting dimensional accuracy of the second gate electrode 500 that is formed though back exposure.

In one embodiment of the present disclosure, materials of the second gate electrode 500 are not particularly limited, as long as the second gate electrode 500 of that material is transparent and conductive. The materials of the second gate electrode 500 may be selected according to performance requirements of the thin film transistor. In one embodiment of the present disclosure, the second gate electrode 500 may be made of indium tin oxide (ITO), aluminum doped zinc oxide (AZO), indium zinc oxide (IZO), or 4,4'-azo-1H-1,2,4-triazol-5-one ammonium salt (AZTO). Then, the second gate electrode 500 made of the above material is transparent, thereby not affecting dimensional accuracy of the second gate electrode 500 that is formed though back exposure.

In one embodiment of the present disclosure, as shown in FIG. 3, the thin film transistor may further include an interlayer insulation layer 730 and source-drain electrodes 600. The interlayer insulation layer 730 covers the base substrate 100, the conductive layer 420 and the second gate electrode 500. The source-drain electrodes 600 are electrically connected with the conductive layer 420 through via holes in the interlayer insulation layer 730. Such design can improve structures and functions of the thin film transistor.

In one embodiment of the present disclosure, materials of the first gate insulation layer 710, the second gate insulation layer 720 and the interlayer insulation layer 730 are not particularly limited, and may be transparent insulating materials commonly used in the related art. For example, the first gate insulation layer 710, the second gate insulation layer 720 and the interlayer insulation layer 730 may be made of silicon oxide, silicon nitride or silicon oxynitride. The materials of the first gate insulation layer 710, the second gate insulation layer 720 and the interlayer insulation layer 730 may be selected according to design requirements of the thin film transistor.

In one embodiment of the present disclosure, materials of the source-drain electrodes 600 are not particularly limited. For example, the source-drain electrodes 600 may be made of commonly used metal materials such as Ag, Cu, Al and Mo, multilayer metal materials such as Mo/Cu/Mo, metal alloy materials such as AlNd and MoNb, or stacked structural materials formed by metal and transparent conductive oxides. The materials of the source-drain electrodes 600 may be selected according to performance requirements of the thin film transistor.

As described above, in the thin film transistor provided in one embodiment of the present disclosure, the partially transparent layer is added between the base substrate and the first gate electrode, and the added partially transparent layer can effectively improve light stability of the thin film transistor. Further, the partially transparent layer is not conductive and then there is no parasitic capacitance generated between the partially transparent layer and the source-drain electrodes, thereby improving response speed and performance of the thin film transistor.

According to another aspect of the present disclosure, one embodiment of the present disclosure provides a method for manufacturing thin film transistors. The method will be described in details in conjunction with FIG. 4 to FIG. 10.

Figure 4:
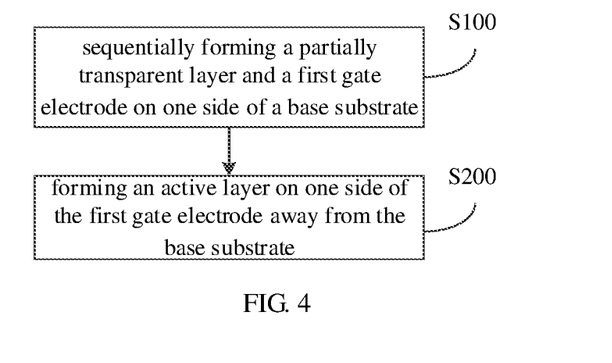
FIG. 4 is a flow chart of a method for manufacturing a thin film transistor according to some embodiments of the present disclosure.

In one embodiment of the present disclosure, as shown in FIG. 4, the method includes the following steps.

At step S100, a partially transparent layer and a first gate electrode are sequentially formed on one side of a base substrate.

At this step, the partially transparent layer 200 and the first gate electrode 300 are sequentially formed on one side of the base substrate 100, and the partially transparent layer 200 may be made of insulating material.

In one embodiment of the present disclosure, ways for forming the partially transparent layer 200 and the first gate electrode 300 are not particularly limited, and may be selected according to materials and shapes of the partially transparent layer 200 and the first gate electrode 300.

In one embodiment of the present disclosure, the step S100 may include the following steps S110-S140.

Figure 5:
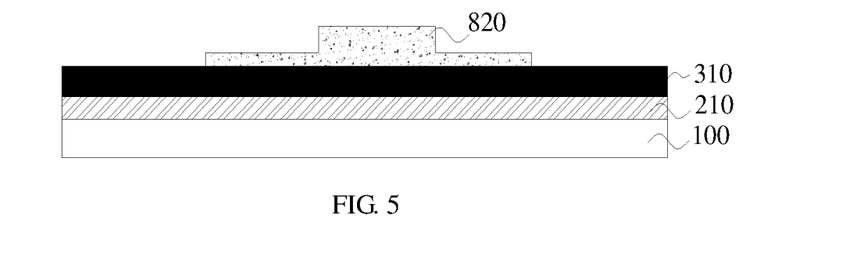
FIG. 5 is a schematic view of an intermediate structure obtained through a step S110 of the method for manufacturing a thin film transistor according to some embodiments of the present disclosure.

At the step S110, a semi-transparent material layer 210, a first gate electrode material layer 310 and a second photoresist layer 820 are sequentially formed on one side of the base substrate. An intermediate structure obtained through this step is shown in FIG. 5.

At the step S120, portions of the semi-transparent material layer 210 and the first gate electrode material layer 310, in regions that are not protected by the second photoresist layer 820, are etched, thereby forming the partially transparent layer 200.

Figure 6:
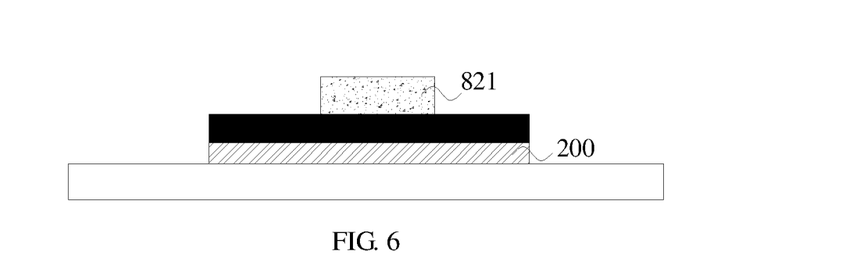
FIG. 6 is a schematic view of an intermediate structure obtained through a step S130 of the method for manufacturing a thin film transistor according to some embodiments of the present disclosure.

At the step S130, the second photoresist layer 820 is ashed, thereby obtaining a second photoresist pattern 821. An intermediate structure obtained through this step is shown in FIG. 6.

Figure 7:
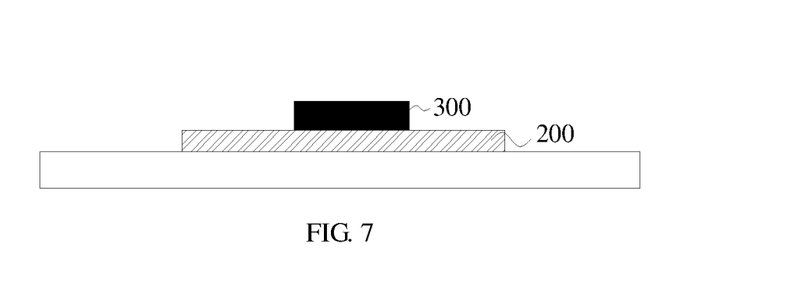
FIG. 7 is a schematic view of an intermediate structure obtained through a step S140 of the method for manufacturing a thin film transistor according to some embodiments of the present disclosure.

At the step S140, portions of the first gate electrode material layer 310, which are not protected by the second photoresist pattern 821, are etched, thereby forming the first gate electrode 300, and then the second photoresist pattern 821 is peeled off. An intermediate structure obtained through this step is shown in FIG. 7.

In this way, the partially transparent layer 200 and the first gate electrode 300 of different shapes may be obtained by using only one photoresist layer.

In one embodiment of the present disclosure, an orthographic projection of the partially transparent layer 200 to the base substrate 100 covers an orthographic projection of the first gate electrode 300 to the base substrate 100. An area of the orthographic projection of the partially transparent layer 200 to the base substrate 100 is less than an area of the base substrate 100. In this way, in the step S100, the base substrate 100, the partially transparent layer 200 and the first gate electrode 300 may be used as a light transmission region, a semi-transparent region and an opaque region of a halftone mask, respectively, thereby facilitating back exposure to form a self-aligned double gate structure.

At step S200, an active layer is formed on one side of the first gate electrode away from the base substrate.

In this step, the active layer 400 is formed on one side of the first gate electrode 300 away from the base substrate 100. The orthographic projection of the partially transparent layer 200 to the base substrate 100 covers an orthographic projection of the active layer 400 to the base substrate 100. In one embodiment of the present disclosure, ways for forming the active layer 400 are not particularly limited, and may be selected according to materials and shapes of the active layer 400.

In one embodiment of the present disclosure, the step S200 further includes the following steps S210-S230.

At the step S210, a semiconductor material layer, a first gate insulation material layer, a second gate electrode material layer and a first photoresist material layer are formed on one side of the first gate electrode away from the base substrate.

In one embodiment of the present disclosure, a second gate insulation material layer 711, a semiconductor material layer 410, a first gate insulation material layer 721, a second gate electrode material layer 510 and a first photoresist material layer may be formed on a surface of the first gate electrode 300 and the partially transparent layer 200 away from the base substrate 100. In this way, the subsequent steps may use only one photoresist layer to obtain the first gate insulation layer and the active layer, the second gate insulation layer and the second gate electrode in different shapes. Further, the base substrate 100 is transparent, the partially transparent layer 200 is semi-transparent, the first gate electrode 300 is opaque, and the second gate insulation material layer 711, the semiconductor material layer 410, the first gate insulation material layer 721 and the second gate electrode material layer 510 are transparent, thereby improving dimensional accuracy of the subsequent photolithography process with back exposure.

At the step S220, by taking the base substrate, the partially transparent layer and the first gate electrode as a halftone mask, the first photoresist material layer is exposed and developed from one side of the base substrate away from the partially transparent layer, thereby obtaining the first photoresist layer.

Figure 8:
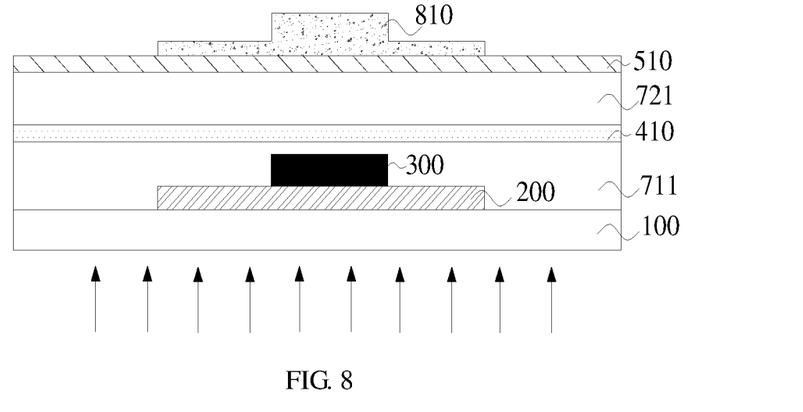
FIG. 8 is a schematic view of an intermediate structure obtained through a step S320 of the method for manufacturing a thin film transistor according to some embodiments of the present disclosure.

In one embodiment of the present disclosure, by taking the base substrate 100, the partially transparent layer 200 and the first gate electrode 300 as a light transmission region, a semi-transparent region and an opaque region of a halftone mask, respectively, the first photoresist material layer is exposed and developed from one side of the base substrate 100 away from the partially transparent layer 200, thereby obtaining a first photoresist layer 810. An intermediate structure obtained through this step is shown in FIG. 8. The first photoresist layer 810 has a first thickness region and a second thickness region. A thickness of the first thickness region is greater than a thickness of the second thickness region. An orthographic projection of the first thickness region to the base substrate 100 and the orthographic projection of the first gate electrode 300 to the base substrate 100 coincide with each other. An orthographic projection of the first thickness region as well as the second thickness region to the base substrate 100 and the orthographic projection of the partially transparent layer 200 to the base substrate 100 coincide with each other. In this way, portions of the obtained first photoresist layer 810 corresponding to the opaque region have a thickness greater than a thickness of portions of the obtained first photoresist layer 810 corresponding to the semi-transparent region.

In one embodiment of the present disclosure, the first photoresist material layer may be made of positive photoresist. Then, when the first photoresist material layer is exposed and developed from one side of the base substrate 100 away from the partially transparent layer 200 by taking the partially transparent layer 200 and the first gate electrode 300 as a mask, thereby forming the first photoresist layer 810 in a shaped required for the first gate insulation layer 710 and a top gate electrode 500.

At the step S230, portions of the semiconductor material layer, the first gate insulation material layer and the second gate insulation material layer, which are not covered by the first photoresist layer, are subject to a first etching treatment, thereby obtaining a semiconductor material layer pattern, a first gate insulation material layer pattern and a second gate insulation material layer pattern.

Figure 9:
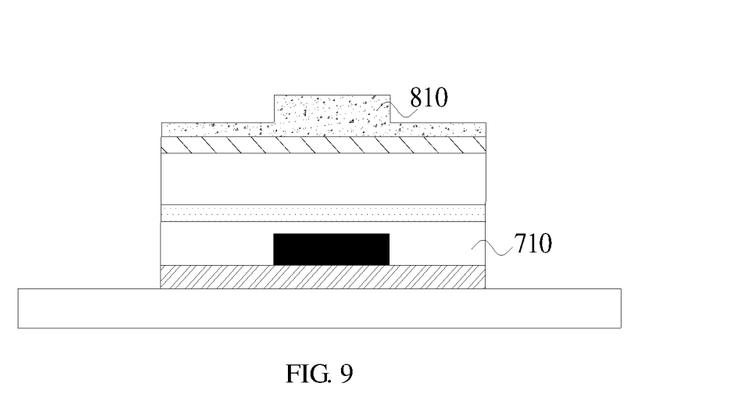
FIG. 9 is a schematic view of an intermediate structure obtained through a step S320 of the method for manufacturing a thin film transistor according to some embodiments of the present disclosure.

In one embodiment of the present disclosure, portions of the second gate electrode material layer 510, the first gate insulation material layer 721, the semiconductor material layer 410 and the second gate insulation material layer 711, which are not covered by the first photoresist layer 810, are subject to the first etching treatment, thereby obtaining the semiconductor material layer pattern, the first gate insulation material layer pattern, the second gate electrode material layer pattern and the first gate insulation layer 710. An intermediate structure obtained through this step is shown in FIG. 9. Then, an orthographic projection of the semiconductor material layer pattern to the base substrate 100 and the orthographic projection of the partially transparent layer 200 to the base substrate 100 coincide with each other.

In one embodiment of the present disclosure, after the step S230, the step S200 further includes the following steps S240-S260.

At the step S240, the first photoresist layer is subject to a first ashing treatment, thereby obtaining a first photoresist pattern.

In this step, the first photoresist layer 810 is subject to the first ashing treatment, thereby obtaining the first photoresist pattern 811. An orthographic projection of the first photoresist pattern 811 to the base substrate 100 and the orthographic projection of the first gate electrode 300 to the base substrate 100 coincide with each other, thereby ensuring dimensional accuracy of the subsequently formed second gate electrode 500 and the active layer 400. In one embodiment of the present disclosure, types of the ashing treatment are not particularly limited, such as plasma ashing treatment. The types of the ashing treatment may be selected according to types of the photoresist.

At the step S250, portions of the first gate insulation material layer pattern and the second gate electrode material layer pattern, which are not protected by the first photoresist pattern, are subject to a second ashing treatment, thereby obtaining the second gate electrode and the second gate insulation layer.

In one embodiment of the present disclosure, the portions of the first gate insulation material layer 721 and the second gate electrode material layer 510, which are not protected by the first photoresist pattern 811, are subject to the second ashing treatment from one side of the second gate electrode material layer 510 away from the base substrate 100, thereby forming the second gate electrode 500 and the second gate insulation layer 720. Then, an orthographic projection of the second gate electrode 500 and the second gate insulation layer 720 to the base substrate 100 and the orthographic projection of the first gate electrode 300 to the base substrate 100 coincide with each other.

At the step S260, portions of the semiconductor material layer pattern, which are not protected by the first photoresist pattern, are subject to a conducting treatment.

Figure 10:
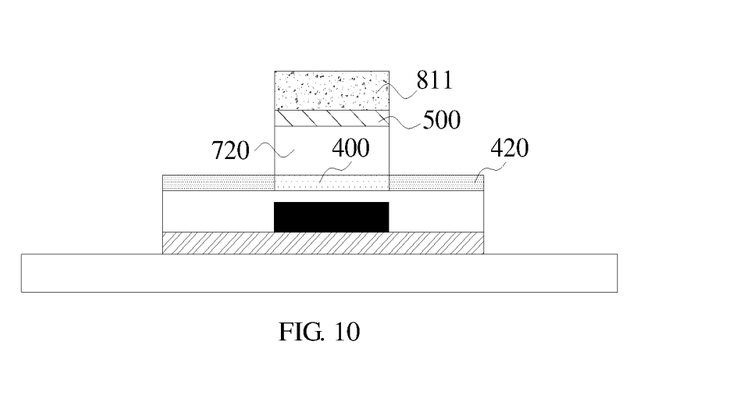
FIG. 10 is a schematic view of an intermediate structure obtained through a step S330 of the method for manufacturing a thin film transistor according to some embodiments of the present disclosure.

In one embodiment of the present disclosure, the portions of the semiconductor material layer pattern, which are not protected by the first photoresist pattern 811, are subject to the conducting treatment, thereby obtaining the conductive layer 420 and the active layer 400. Then, the orthographic projection of the active layer 400 to the base substrate 100 and the orthographic projection of the second gate electrode 500 to the base substrate 100 coincide with each other. An intermediate structure obtained through this step is shown in FIG. 10.

At the step S300, an interlayer insulation layer and source-drain electrodes are sequentially formed on one side of the second gate electrode and the conductive layer away from the base substrate.

In one embodiment of the present disclosure, on the basis of the intermediate structure obtained after the step S260, the interlayer insulation layer 730 and source-drain electrodes 600 are sequentially formed on one side of the second gate electrode 500 and the conductive layer 420 away from the base substrate 100. The interlayer insulation layer 730 covers the base substrate 100, the conductive layer 420 and the second gate electrode 500. The source-drain electrodes 600 are electrically connected with the conductive layer 420 through via holes in the interlayer insulation layer 730. Such design can improve structures and functions of the thin film transistor. A product obtained through this step is shown in FIG. 3.

As described above, the method provided in one embodiment of the present disclosure can produce thin film transistors with better light stability, faster response speed and better performance.

According to another aspect of the present disclosure, one embodiment of the present disclosure provides an array substrate that includes the above thin film transistor.

It should be noted, in addition to the thin film transistor, the array substrate further includes other necessary components and structures, such as a pixel electrode layer, a passivation layer, and a common electrode layer, which may be designed and supplemented according to specific functions of the array substrate and will not be elaborated herein.

As described above, in the array substrate provided in one embodiment of the present disclosure, since the thin film transistor has better light stability, faster response speed and better device performance, the array substrate has better usage stability, faster response speed and better performance accordingly. It should be noted that, features and advantages described above with respect to the thin film transistor are also suitable for the array substrate.

According to another aspect of the present disclosure, one embodiment of the present disclosure provides a display panel that includes the above array substrate.

In one embodiment of the present disclosure, types of the display panel are not particularly limited, such as a top emission display panel or a bottom emission display panel. The types of the display panel may be selected according to usage requirements of the display panel.

It should be noted, in addition to the array substrate, the display panel further includes other necessary components and structures, such as a cover plate for an OLED display panel, which may be designed and supplemented according to specific types of the display panel and will not be elaborated herein.

As described above, in the display panel provided in one embodiment of the present disclosure, since the array substrate has better usage stability, faster response speed and better performance, the display panel has better usage stability accordingly. It should be noted that, features and advantages described above with respect to the thin film transistor and the array substrate are also suitable for the display panel.

In the above description of the present disclosure, unless specified or limited otherwise, relative terms such as "central", "longitudinal", "lateral", "length", "width", "thickness", "up", "down", "front", "rear", "left", "right", "vertical", "horizontal", "top", "bottom", "inner", "outer", "clockwise", "anticlockwise" as well as derivative thereof (e.g., "horizontally", "downwardly", "upwardly", etc.) should be construed to refer to the orientation as then described or as shown in the drawings under discussion. These relative terms are for convenience of description and do not require that the present disclosure be constructed or operated in a particular orientation.

In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two.

In the above description of the present disclosure, reference to "an embodiment," "some embodiments," "one embodiment", "another example," "an example," "a specific example," or "some examples," means that a particular feature, structure, material, or characteristic described in connection with the embodiment or example is included in at least one embodiment or example of the present invention. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present invention. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present invention, and changes, alternatives, and modifications can be made in the embodiments without departing from spirit, principles and scope of the present invention.

What is claimed is:

1. A thin film transistor comprising:
a base substrate;
a partially transparent layer on one side of the base substrate;
a first gate electrode on one side of the partially transparent layer away from the base substrate;
a first gate insulation layer on one side of the first gate electrode away from the base substrate; and
an active layer on one side of the first gate insulation layer away from the base substrate;
wherein an orthographic projection of the partially transparent layer to the base substrate covers an orthographic projection of the active layer to the base substrate
wherein the orthographic projection of the partially transparent layer to the base substrate covers an orthographic projection of the first gate electrode to the base substrate; and an area of the orthographic projection of the partially transparent layer to the base substrate is less than an area of the base substrate;
wherein the orthographic projection of the active layer to the base substrate and the orthographic projection of the first gate electrode to the base substrate coincide with each other; the first gate electrode is opaque; and the base substrate, the first gate insulation layer and the active layer are transparent.

2. The thin film transistor of claim 1, wherein the active layer is made of oxide semiconductor material.

3. The thin film transistor of claim 1, further comprising:
a second gate electrode on one side of the active layer away from the base substrate; and
a second gate insulation layer between the second gate electrode and the active layer;
wherein an orthographic projection of the second gate electrode to the base substrate and the orthographic projection of the first gate electrode to the base substrate coincide with each other;
wherein an orthographic projection of the second gate insulation layer to the base substrate and the orthographic projection of the first gate electrode to the base substrate coincide with each other; and
wherein the second gate insulation layer and the second gate electrode are transparent.

4. The thin film transistor of claim 1, wherein the partially transparent layer is made of insulating material.

5. The thin film transistor of claim 1, further comprising a conductive layer, wherein:
the conductive layer and the active layer are in an identical layer;
the conductive layer is disposed at two opposite sides of the active layer;
the conductive layer is formed by conducting material of the active layer; and
a sum of an orthographic projection of the conductive layer to the base substrate and the orthographic projection of the active layer to the base substrate coincides with the orthographic projection of the partially transparent layer to the base substrate.

6. The thin film transistor of claim 1, wherein the partially transparent layer is made of amorphous silicon.

7. The thin film transistor of claim 3, wherein the second gate electrode is made of at least one of indium tin oxide, aluminum doped zinc oxide, indium zinc oxide, and 4,4'-azo-1H-1,2,4-triazol-5-one ammonium salt.

8. The thin film transistor of claim 1, wherein the active layer is made of indium gallium zinc oxide.

9. A method for manufacturing the thin film transistor of claim 1,
the method comprises:
sequentially forming the partially transparent layer and the first gate electrode on one side of the base substrate, with the partially transparent layer being made of insulating material; and
forming the active layer on one side of the first gate electrode away from the base substrate, with the orthographic projection of the partially transparent layer to the base substrate covering an orthographic projection of the active layer to the base substrate.

10. The method of claim 9, wherein the forming the active layer on one side of the first gate electrode away from the base substrate includes:
sequentially forming a semiconductor material layer, a first gate insulation material layer, a second gate electrode material layer and a first photoresist material layer on one side of the first gate electrode away from the base substrate; by taking the base substrate, the partially transparent layer and the first gate electrode as a halftone mask, exposing and developing the first photoresist material layer from one side of the base substrate away from the partially transparent layer, thereby obtaining a first photoresist layer; wherein the partially transparent layer is semi-transparent; the first gate electrode is opaque; the base substrate, the semiconductor material layer, the first gate insulation material layer and the second gate electrode material layer are transparent; the first photoresist layer is made of positive photoresist and has a first thickness region and a second thickness region; a thickness of the first thickness region is greater than a thickness of the second thickness region; an orthographic projection of the first thickness region to the base substrate and the orthographic projection of the first gate electrode to the base substrate coincide with each other; a sum of the orthographic projection of the first thickness region to the base substrate and an orthographic projection of the second thickness region to the base substrate coincide with the orthographic projection of the partially transparent layer to the base substrate; and
performing a first etching treatment to portions of the semiconductor material layer, the first gate insulation material layer and the second gate insulation material layer, which are not covered by the first photoresist layer, thereby obtaining a semiconductor material layer pattern, a first gate insulation material layer pattern and a second gate insulation material layer pattern;
wherein an orthographic projection of the semiconductor material layer pattern to the base substrate and the orthographic projection of the partially transparent layer to the base substrate coincide with each other.

11. The method of claim 10, wherein after the first etching treatment, forming the active layer on one side of the first gate electrode away from the base substrate further includes:
performing a first ashing treatment to the first photoresist layer, thereby obtaining a first photoresist pattern with an orthographic projection of the first photoresist pattern to the base substrate coinciding with the orthographic projection of the first gate electrode to the base substrate; and performing a second ashing treatment to portions of the first gate insulation material layer pattern and the second gate electrode material layer pattern, which are not protected by the first photoresist pattern, thereby forming the second gate electrode and the second gate insulation layer;

wherein an orthographic projection of the second gate electrode and the orthographic projection of the second gate electrode to the base substrate coincide with each other, and an orthographic projection of the first gate insulation layer to the base substrate and the orthographic projection of the first gate electrode to the base substrate coincide with each other.

12. The method of claim 11, wherein after the second etching treatment, forming the active layer on one side of the first gate electrode away from the base substrate further includes:

performing a conducting treatment to portions of the semiconductor material layer pattern, which are not protected by the first photoresist pattern, thereby forming a conductive layer and the active layer;

wherein the orthographic projection of the active layer to the base substrate and the orthographic projection of the second gate electrode to the base substrate coincide with each other.

13. An array substrate comprising a thin film transistor, the thin film transistor including:

a base substrate;

a partially transparent layer on one side of the base substrate;

a first gate electrode on one side of the partially transparent layer away from the base substrate;

a first gate insulation layer on one side of the first gate electrode away from the base substrate; and an active layer on one side of the first gate insulation layer away from the base substrate;

wherein an orthographic projection of the partially transparent layer to the base substrate covers an orthographic projection of the active layer to the base substrate;

wherein the orthographic projection of the partially transparent layer to the base substrate covers an orthographic projection of the first gate electrode to the base substrate; and an area of the orthographic projection of the partially transparent layer to the base substrate is less than an area of the base substrate;

wherein the orthographic projection of the active layer to the base substrate and the orthographic projection of the first gate electrode to the base substrate coincide with each other; the first gate electrode is opaque; the base substrate, the first gate insulation layer and the active layer are transparent.

14. The array substrate of claim 13, wherein the active layer is made of oxide semiconductor material.

15. A display panel comprising the array substrate of claim 13.

* * * * *